US010804209B2

(12) United States Patent
Kang (10) Patent No.: US 10,804,209 B2
(45) Date of Patent: Oct. 13, 2020

(54) SEMICONDUCTOR PACKAGES INCLUDING A SUPPORTING BLOCK SUPPORTING AN UPPER CHIP STACK

(71) Applicant: SK hynix Inc., Icheon-si, Gyeonggi-do (KR)

(72) Inventor: Min Kyu Kang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 42 days.

(21) Appl. No.: 16/220,958

(22) Filed: Dec. 14, 2018

(65) Prior Publication Data

US 2020/0126919 A1   Apr. 23, 2020

(30) Foreign Application Priority Data

Oct. 18, 2018  (KR) .................... 10-2018-0124443

(51) Int. Cl.
*H01L 23/538* (2006.01)
*H01L 27/115* (2017.01)
*H01L 23/498* (2006.01)
*H01L 23/00* (2006.01)
*H01L 25/065* (2006.01)
*H01L 23/522* (2006.01)

(52) U.S. Cl.
CPC .... *H01L 23/5386* (2013.01); *H01L 23/49811* (2013.01); *H01L 23/49838* (2013.01); *H01L 23/5226* (2013.01); *H01L 24/09* (2013.01); *H01L 24/33* (2013.01); *H01L 24/49* (2013.01); *H01L 25/0657* (2013.01); *H01L 27/115* (2013.01); *H01L 2224/02372* (2013.01)

(58) Field of Classification Search
CPC .......... H01L 23/5386; H01L 23/49811; H01L 23/49838; H01L 23/5226; H01L 23/538; H01L 23/498; H01L 23/00; H01L 23/522; H01L 27/115; H01L 25/065; H01L 25/0657; H01L 24/09; H01L 23/33; H01L 24/49; H01L 2224/02372
USPC ........................................................ 257/692
See application file for complete search history.

(56) References Cited

U.S. PATENT DOCUMENTS

| 8,552,546 B2 | 10/2013 | Song et al. |
| 9,412,714 B2 * | 8/2016 | Co ........................ H01L 24/17 |
| 2008/0042249 A1 * | 2/2008 | Haba .................. H01L 23/3121 |
| | | 257/686 |
| 2008/0136006 A1 * | 6/2008 | Jang ................... H01L 23/3128 |
| | | 257/686 |

(Continued)

FOREIGN PATENT DOCUMENTS

| KR | 1020150009146 A | 1/2015 |
| KR | 1020150049712 A | 5/2015 |

*Primary Examiner* — Alexander O Williams
(74) *Attorney, Agent, or Firm* — William Park & Associates Ltd.

(57) ABSTRACT

A semiconductor package includes a package substrate, a first chip stack, a second chip stack, and a supporting block. The first chip stack includes first semiconductor chips stacked on the package substrate to be offset in a first direction, and the second chip stack includes second semiconductor chips stacked on the first chip stack to be offset in a second direction. The supporting block includes a through via structure. The second chip stack is supported by the first chip stack and the supporting block.

20 Claims, 9 Drawing Sheets

(56) References Cited

U.S. PATENT DOCUMENTS

| | | | | |
|---|---|---|---|---|
| 2008/0136007 A1* | 6/2008 | Kim | .................... | H01L 23/3128 |
| | | | | 257/686 |
| 2009/0045524 A1* | 2/2009 | Mohammed | ............ | H01L 23/13 |
| | | | | 257/777 |
| 2010/0244227 A1* | 9/2010 | Kim | .................... | H01L 23/3128 |
| | | | | 257/692 |
| 2013/0056882 A1* | 3/2013 | Kim | ........................ | H01L 23/16 |
| | | | | 257/777 |
| 2015/0061157 A1* | 3/2015 | Yu | ........................ | H01L 25/0657 |
| | | | | 257/777 |
| 2017/0141092 A1* | 5/2017 | Kim | .................... | H01L 25/0652 |
| 2018/0145053 A1* | 5/2018 | Jung | ........................ | H01L 24/32 |
| 2019/0035705 A1* | 1/2019 | Mao | ........................ | H01L 24/92 |
| 2020/0013767 A1* | 1/2020 | Baik | .................... | H01L 23/147 |

\* cited by examiner

SEMICONDUCTOR PACKAGES INCLUDING A SUPPORTING BLOCK SUPPORTING AN UPPER CHIP STACK

CROSS-REFERENCE TO RELATED APPLICATIONS

The present application claims priority under 35 U.S.C 119(a) to Korean Application No. 10-2018-0124443, filed on Oct. 18, 2018, which is incorporated herein by references in its entirety.

BACKGROUND

1. Technical Field

The present disclosure relates to semiconductor package technologies and, more particularly, to semiconductor packages including a supporting block supporting an upper chip stack.

2. Related Art

Semiconductor packages having a large capacity are required in various electronic products. Accordingly, various package structures have been proposed to increase the number of semiconductor chips embedded in one semiconductor package. For example, at least two semiconductor chips may be stacked to provide a stack package. Significant effort has been focused on stacking a plurality of semiconductor chips to increase the number of the semiconductor chips embedded in the limited space of a single semiconductor package.

SUMMARY

According to an embodiment, a semiconductor package includes a first chip stack including first semiconductor chips vertically stacked on a package substrate, wherein the first semiconductor chips are offset in a first direction. The semiconductor package also includes an interposer including a redistributed layer (RDL) pattern, wherein the interposer is disposed on the package substrate and laterally spaced apart from the first chip stack. The RDL pattern includes a first connection part, a second connection part, and an extension part connecting the first connection part to the second connection part. The semiconductor package further includes a supporting block vertically stacked on the interposer, wherein the supporting block includes a through via structure with a lower end electrically connected to the first connection part of the interposer. The semiconductor package additionally includes a second chip stack including second semiconductor chips vertically stacked on both of the first chip stack and the supporting block, wherein the second semiconductor chips are offset in a second direction. The semiconductor package also includes a first interconnector electrically connecting the first semiconductor chips to the package substrate and a second interconnector electrically connecting the second semiconductor chips to an upper end of the through via structure. The semiconductor package further includes a third interconnector electrically connecting the second connection part of the interposer to the package substrate.

According to another embodiment, a semiconductor package includes a package substrate including a bonding finger. The semiconductor package also includes a first chip stack disposed on the package substrate to be spaced apart from the bonding finger, the first chip stack including first semiconductor chips stacked to be offset in a first direction. The semiconductor package further includes a supporting block disposed on the package substrate to be spaced part from the first chip stack, the supporting block including a through via structure having a lower end that is electrically connected to the bonding finger. The semiconductor package additionally includes a second chip stack including second semiconductor chips that are vertically stacked on both of the first chip stack and the supporting block, wherein the second semiconductor chips are offset in a second direction. The semiconductor package also includes a first interconnector electrically connecting the first semiconductor chips to the package substrate and a second interconnector electrically connecting the second semiconductor chips to an upper end of the through via structure.

DETAILED DESCRIPTION OF THE EMBODIMENTS

The terms used herein may correspond to words selected in consideration of their functions in presented embodiments, and the meanings of the terms may be construed to be different according to the ordinary skill in the art to which the embodiments belong. If defined in detail, the terms may be construed according to the provided definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various elements, the elements should not be limited by these terms. These terms are only used to distinguish one element from another element and are not used to imply hierarchy or a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom," and the like, may be used to describe an element and/or a feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (e.g., rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate, such as a wafer, into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) circuits, which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 1:
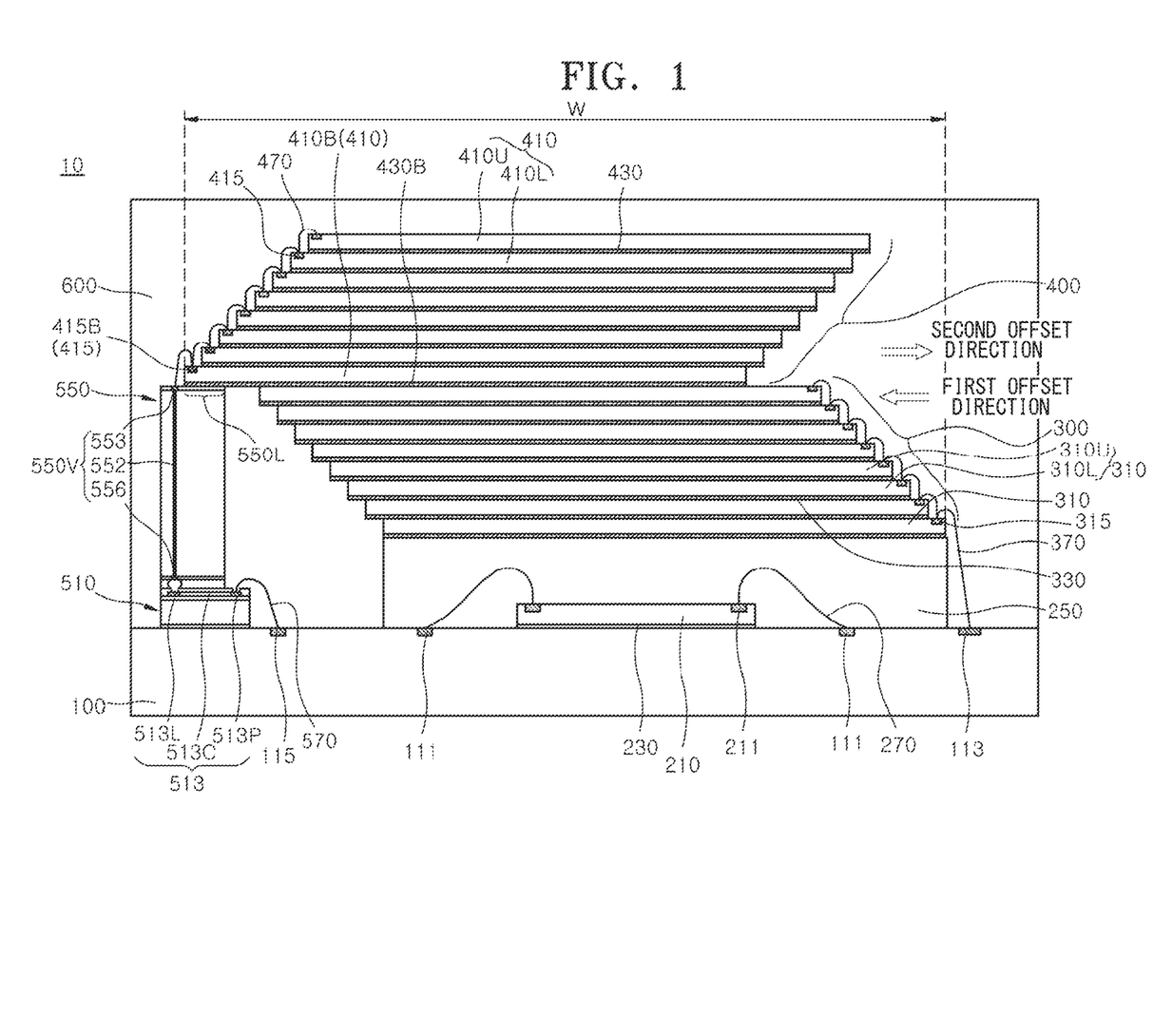
FIG. 1 shows a cross-sectional view illustrating a semiconductor package, according to an embodiment.

FIG. 1 shows a cross-sectional view illustrating a semiconductor package 10, according to an embodiment.

Referring to FIG. 1, the semiconductor package 10 may be configured to include a package substrate 100, a first chip stack 300, and an interposer 510. The first chip stack 300 may be disposed on the package substrate 100 to be laterally spaced apart from the interposer 510. A second chip stack 400 may be additionally stacked on the first chip stack 300. A supporting block 550 may be disposed to be vertically erected on the interposer 510. The second chip stack 400 may extend onto the supporting block 550.

Accordingly, the second chip stack 400 may be supported by the supporting block 550 and the first chip stack 300.

The first chip stack 300 may include a plurality of first semiconductor chips 310, which are stacked to be offset in a first offset direction. The first semiconductor chips 310 may be attached to each other by adhesive layers 330 disposed therebetween. The second chip stack 400 may include a plurality of second semiconductor chips 410, which are stacked to be offset in a second offset direction that is substantially opposite to the first offset direction. The second semiconductor chips 410 may be attached to each other by adhesive layers 430 disposed therebetween.

The first semiconductor chips 310 may be memory semiconductor chips, for example, NAND-type flash memory devices. Each of the first semiconductor chips 310 may include first chip pads 315 for electrical connection thereof. If one of the first semiconductor chips 310 corresponds to a first upper semiconductor chip 310U and another one of the first semiconductor chips 310 corresponds to a first lower semiconductor chip 310L located beneath the first upper semiconductor chip 310U, the first upper semiconductor chip 310U may be offset relative to the first lower semiconductor chip 310L in the first offset direction to reveal the first chip pads 315 of the first lower semiconductor chip 310L.

The second semiconductor chips 410 may be memory semiconductor chips, for example, NAND-type flash memory devices. Each of the second semiconductor chips 410 may include second chip pads 415 for electrical connection thereof. If one of the second semiconductor chips 410 corresponds to a second upper semiconductor chip 410U and another one of the second semiconductor chips 410 corresponds to a second lower semiconductor chip 410L located beneath the second upper semiconductor chip 410U, the second upper semiconductor chip 410U may be offset relative to the second lower semiconductor chip 410L in the second offset direction to reveal the second chip pads 415 of the second lower semiconductor chip 410L.

In the event that the first semiconductor chips 310 are stacked to be offset in the first offset direction and the second semiconductor chips 410 are stacked to be offset in the second offset direction opposite to the first offset direction, a width W of an entire structure including all of the first and second semiconductor chips 310 and 410 may be reduced as compared with a case for which all of the first and second semiconductor chips 310 and 410 are stacked to be offset in one offset direction. If the second semiconductor chips 410 are stacked on the first chip stack 300 to be continuously offset in the same offset direction as the first offset direction of the first semiconductor chips 310, a width of the entire structure including the first and second semiconductor chips 310 and 410 stacked to be offset in only the first offset direction may be greater than the width W of the structure including all of the first and second semiconductor chips 310 and 410 illustrated in FIG. 1. As such, because an offset direction (i.e., the first offset direction) of the first semiconductor chips 310 is opposite to an offset direction (i.e., the second offset direction) of the second semiconductor chips 410, an entire width of the semiconductor package 10 may be reduced.

The first chip stack 300 may be electrically connected to the package substrate 100 through first interconnectors 370. That is, the first interconnectors 370 may electrically connect the first semiconductor chips 310 to the package substrate 100. The first interconnectors 370 may include first bonding wires. If the first bonding wires are employed as the first interconnectors 370, the first bonding wires may electrically connect the first chip pads 315 of the first semiconductor chips 310 to each other. In addition, the first bonding wires may further extend to be electrically connected to first bonding fingers 113 of the package substrate 100.

The first bonding fingers 113 of the package substrate 100 may be a portion of a circuit interconnection structure (not shown) included in the package substrate 100. The package substrate 100 may be a substrate including a circuit interconnection structure, for example, a printed circuit board (PCB). The first bonding fingers 113 of the package substrate 100 may be disposed outside a region overlapped by the first chip stack 300 in order to be connected to the first bonding wires corresponding to the first interconnectors 370.

The second semiconductor chips 410 constituting the second chip stack 400 may be electrically connected to each other through second interconnectors 470. The second interconnectors 470 may extend to electrically connect the second chip stack 400 to the supporting block 550. The supporting block 550 may be electrically connected to the interposer 510 disposed thereunder. The interposer 510 may be electrically connected to the package substrate 100 through third interconnectors 570. The second semiconductor chips 410 may be electrically connected to the package substrate 100 through the second interconnectors 470, the supporting block 550, the interposer 510, and the third interconnectors 570.

The second interconnectors 470 may include second bonding wires. If the second bonding wires are employed as the second interconnectors 470, the second bonding wires may electrically connect the second chip pads 415 of the second semiconductor chips 410 to each other and may further extend to be electrically connected to the supporting block 550. The second interconnectors 470 may be located at one side of the second chip stack 400 opposite to the first interconnectors 370. The first interconnectors 370 may be located at one side of the first chip stack 300 opposite to the supporting block 550. The third interconnectors 570 may include third bonding wires. If the third bonding wires are employed as the third interconnectors 570, the third bonding wires may be disposed to electrically connect the interposer 510 to second bonding fingers 115 of the package substrate 100.

Figure 2:
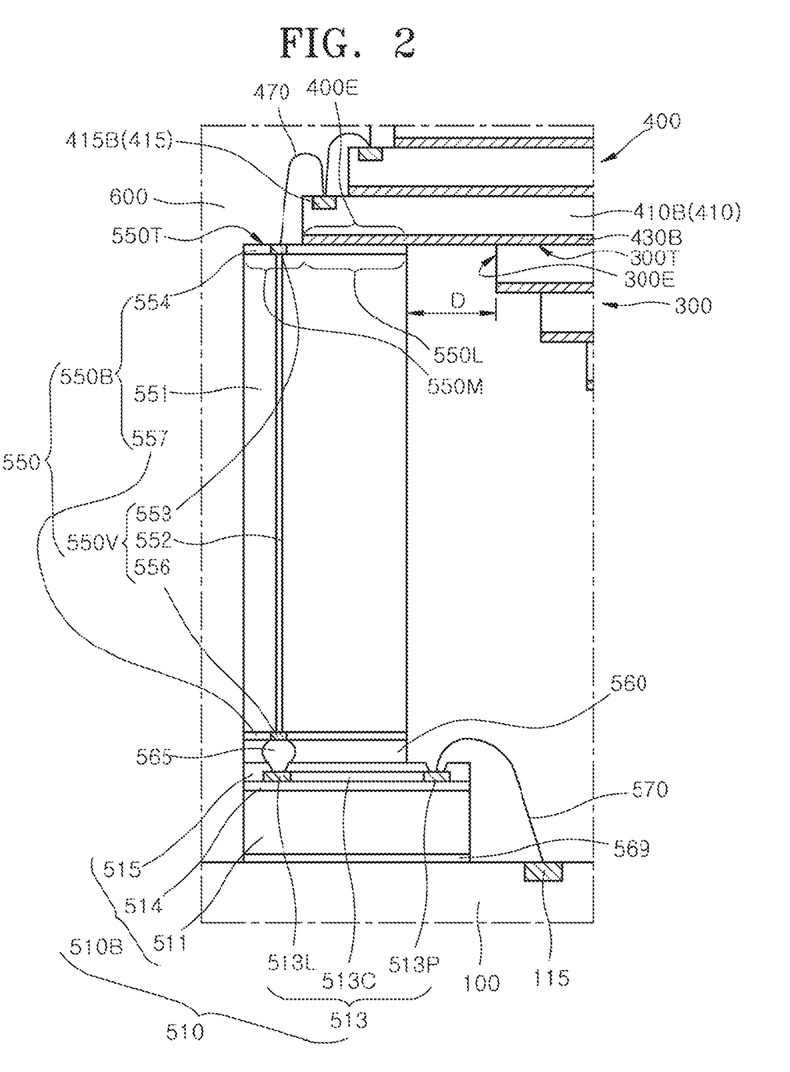
FIG. 2 shows an enlarged view illustrating a joint portion of an interposer and a supporting block included in the semiconductor package of FIG. 1.

FIG. 2 shows an enlarged view illustrating a joint portion of the interposer 510 and the supporting block 550 included in the semiconductor package 10 of FIG. 1.

Referring to FIG. 2, through via structures 550V may be disposed to vertically penetrate the supporting block 550. The second interconnectors 470 may extend to electrically connect the second semiconductor chips 410 of the second chip stack 400 to upper ends of the through via structures 550V. The supporting block 550 may include a block body 550B. The through via structures 550V may be disposed to vertically penetrate the block body 550B of the supporting block 550. Each of the through via structures 550V may be configured to include a first via pad 553 and a second via pad 556 that are opposite to each other as well as a vertical via portion 552 that connects the first via pad 553 to the second via pad 556. The first via pad 553 may provide an upper end of each of the through via structures 550V, and the second via pad 556 may provide a lower end of each of the through via structures 550V.

The block body 550B may be configured to include a silicon body 551, an upper dielectric layer 554, and a lower dielectric layer 557. The upper dielectric layer 554 may be disposed on a top surface of the silicon body 551 opposite to the lower dielectric layer 557, and the lower dielectric layer 557 may be disposed on a bottom surface of the silicon body 551 opposite to the upper dielectric layer 554. The silicon body 551 may include a silicon material corresponding to one of various semiconductor materials and may have a chip shape or a box shape. The upper dielectric layer 554 may be disposed on the top surface of the silicon body 551 to reveal the first via pads 553 of the through via structures 550V. The upper dielectric layer 554 may include a dielectric layer or an insulation layer. The lower dielectric layer 557 may be disposed on the bottom surface of the silicon body 551 to reveal the second via pads 556 of the through via structures 550V. The lower dielectric layer 557 may include a dielectric layer or an insulation layer. The vertical via portions 552 of the through via structures 550V may correspond to through silicon vias (TSVs) vertically penetrating the silicon body 551. Because first ends of the second interconnectors 470 are connected to the first via pads 553 of the through via structures 550V, the second interconnectors 470 may electrically connect the second chip stack 400 to the vertical via portions 552 of the through via structures 550V.

Figure 3:
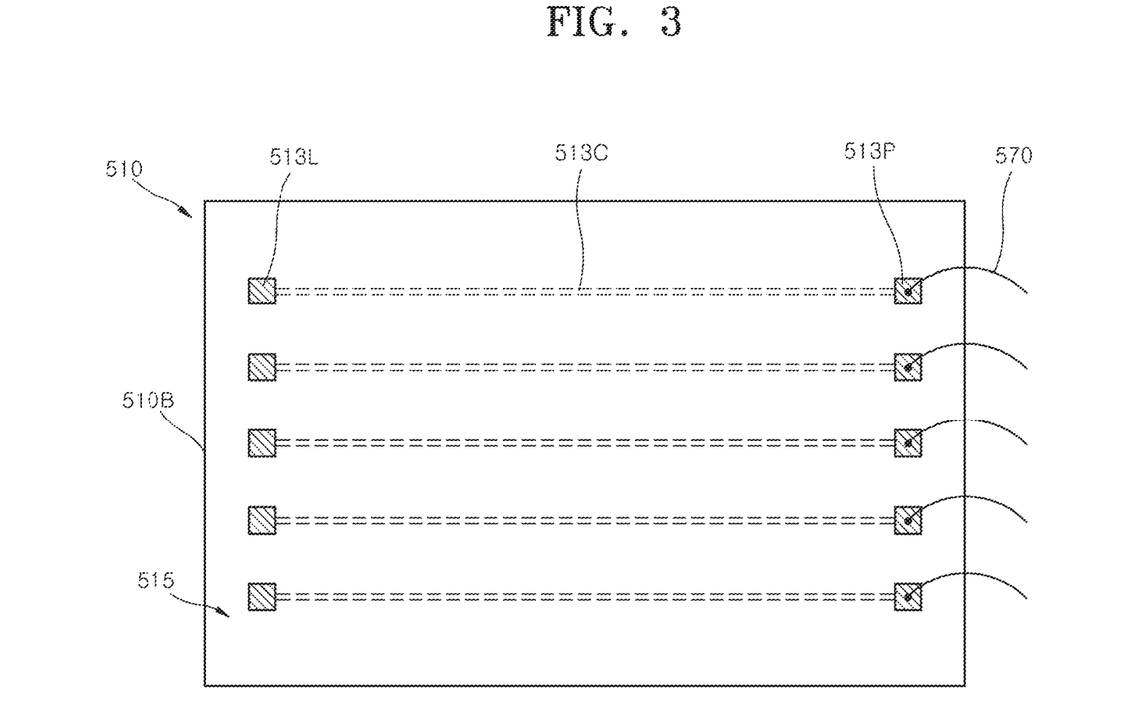
FIG. 3 illustrates an interposer of the semiconductor package shown in FIG. 1.

FIG. 3 shows a plan view illustrating redistributed layer (RDL) patterns 513 of the interposer 510 of the semiconductor package 10 shown in FIG. 1.

Referring to FIGS. 2 and 3, the interposer 510 may be disposed between the supporting block 550 and the package substrate 100. The interposer 510 may be configured to include an interposer body 510B and the RDL patterns 513. The interposer body 510B may have a chip shape. The interposer body 510B may be configured to include a silicon body 511 having a silicon material corresponding to one of various semiconductor materials, a first dielectric layer 514 disposed on a top surface of the silicon body 511 opposite to the package substrate 100, and a second dielectric layer 515 disposed on the first dielectric layer 514 opposite to the silicon body 511. The RDL patterns 513 including metal patterns may be disposed between the first and second dielectric layers 514 and 515. The first dielectric layer 514 may electrically isolate the RDL patterns 513 from the silicon body 511, and the second dielectric layer 515 may electrically isolate the RDL patterns 513 from each other.

Each of the RDL patterns 513 may be a conductive pattern including a first connection part 513L, a second connection part 513P, and an extension part 513C. In each of the RDL patterns 513, the first and second connection parts 513L and 513P may be spaced apart from each other, and the extension part 513C may be a line-shaped pattern connecting the first connection part 513L to the second connection part 513P. The second dielectric layer 515 may cover the extension parts 513C, as indicated by broken lines, of the RDL patterns 513 to be isolated from other elements and may be formed to reveal the first and second connection parts 513L and 513P of the RDL patterns 513. The first connection parts 513L of the RDL patterns 513 may be disposed to face the second via pads 556 of the through via structures 550V, respectively.

Conductive bumps 565 may be disposed between the supporting block 550 and the interposer 510. The conductive bumps 565 may act as inner conductors that electrically connect the supporting block 550 to the interposer 510. The conductive bumps 565 may electrically connect the first connection parts 513L of the RDL patterns 513 to the second via pads 556 (corresponding to lower ends) of the through via structures 550V. The conductive bumps 565 may be electrically insulated from each other by a second adhesive layer 560 surrounding side surfaces of the conductive bumps 565, and the second adhesive layer 560 may attach the supporting block 550 to the interposer 510. The second adhesive layer 560 may be a non-conductive film (NCF).

The supporting block 550 may overlap with a portion of the interposer 510 to reveal the second connection parts 513P of the RDL patterns 513. The supporting block 550 may be disposed to cover the first connection parts 513L of the RDL patterns 513. The RDL patterns 513 may include the extension parts 513C extending from the first connection parts 513L covered with the supporting block 550 to the second connection parts 513P revealed by supporting block 550. The third interconnectors 570 may electrically connect the second connection parts 513P of the RDL patterns 513 to the second bonding fingers 115 of the package substrate 100. First ends of the third bonding wires employed as the third interconnectors 570 may be bonded to the second connection parts 513P of the RDL patterns 513, and second ends of the third bonding wires employed as the third interconnectors 570 may be bonded to the second bonding fingers 115 of the package substrate 100. The second bonding fingers 115 of the package substrate 100 may constitute a portion of the circuit interconnection structure (not shown) included in the package substrate 100.

The second bonding fingers 115 of the package substrate 100 may be disposed to be spaced part from the interposer 510 by a certain distance. A third adhesive layer 569 may be disposed between the interposer 510 and the package substrate 100. The third adhesive layer 569 may include an adhesive material for attaching the interposer 510 to the package substrate 100. The interposer 510 may be attached to the package substrate 100 by the third adhesive layer 569 to reveal the second bonding fingers 115 of the package substrate 100.

The second bonding fingers 115 of the package substrate 100 may be located between a position on which the interposer 510 is disposed and a position on which the first chip stack 300 is stacked. The second bonding fingers 115 of the package substrate 100 may be disposed to be vertically overlapped by the second chip stack 400. The second bonding fingers 115 of the package substrate 100 may be located underneath an overlap region of the second chip stack 400 when viewed from a plan view. If the second bonding fingers 115 are located on an outside region of an overlap region of the second chip stack 400 and the package substrate 100, it may be necessary to increase a width of the package substrate 100. Accordingly, because the second bonding fingers 115 are disposed to be vertically overlapped by the second chip stack 400, a width of the package substrate 100 may be relatively reduced.

Figure 4:
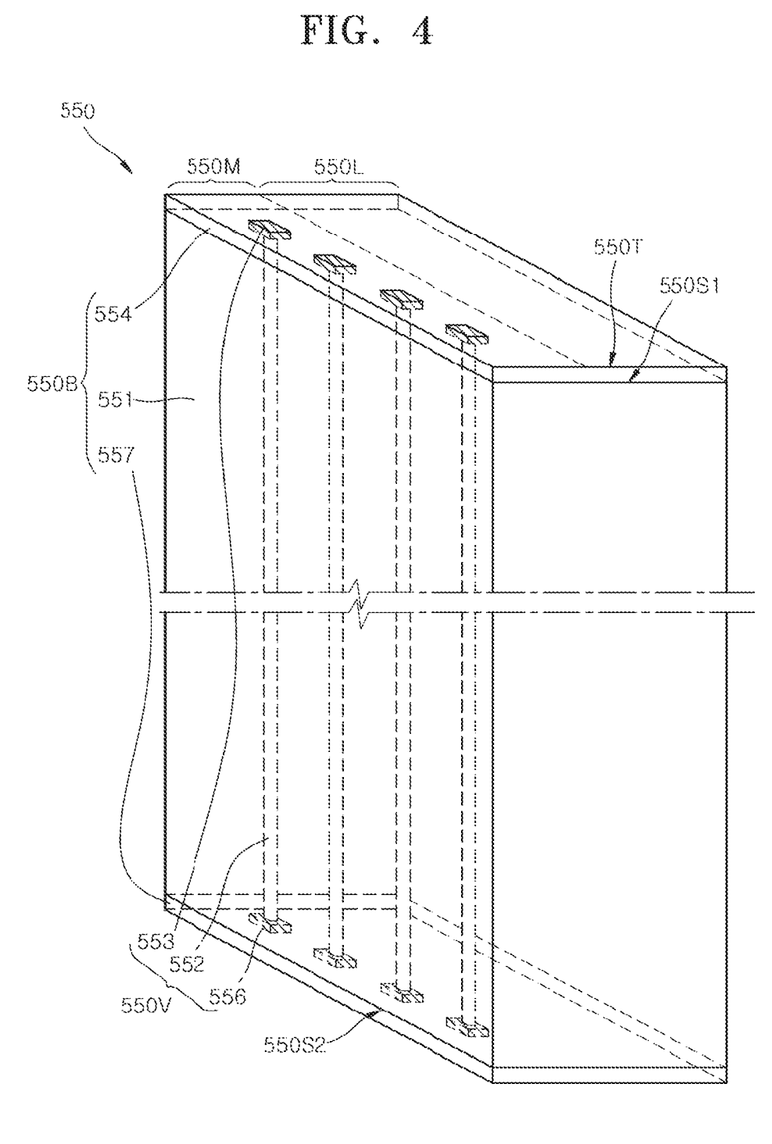
FIG. 4 shows a perspective view illustrating a supporting block of the semiconductor package shown in FIG. 1.
Figure 5:
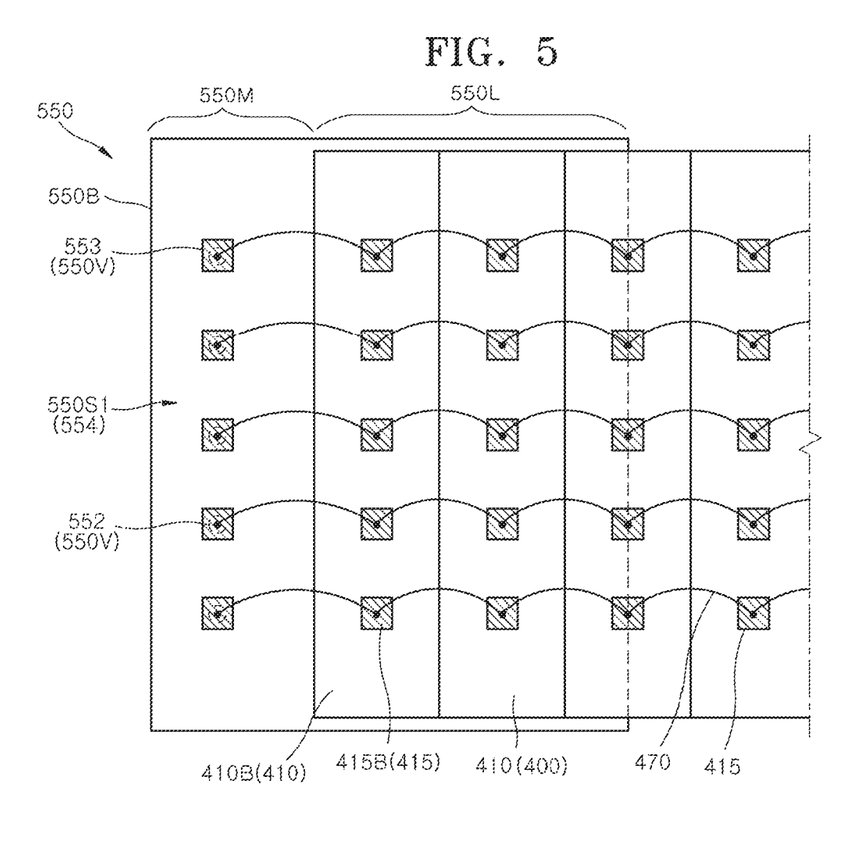
FIG. 5 shows a plan view illustrating a supporting block and a second chip stack included in the semiconductor package of FIG. 1.

FIG. 4 shows a perspective view illustrating the supporting block 550 of the semiconductor package 10 shown in FIG. 1. FIG. 5 is a plan view illustrating the supporting block 550 and the second chip stack 400 supported by the supporting block 550.

Referring to FIG. 4, the supporting block 550 may include a first region 550M and a second region 550L that are divided into two parts. The through via structures 550V may be disposed to be laterally spaced apart from each other in the first region 550M of the supporting block 550. The through via structures 550V may substantially penetrate the block body 550B in the first region 550M of the supporting block 550. The first via pads 553 of the through via structures 550V may be revealed at a top surface 550S1 of the block body 550B, and the second via pads 556 of the through via structures 550V may be revealed at a bottom surface 550S2 of the block body 550B. For an embodiment, none of the through via structures 550V are disposed in the second region 550L of the block body 550B adjacent to the first region 550M of the block body 550B.

Referring again to FIG. 2, in a stack structure for which the second chip stack 400 is stacked on the first chip stack 300, a portion 400E of the second chip stack 400 may laterally protrude from an edge portion 300E of the first chip stack 300. The protruded portion 400E of the second chip stack 400 may be located to vertically overlap with the second region 550L of the supporting block 550. The protruded portion 400E of the second chip stack 400 may be supported by the second region 550L of the supporting block 550. A first adhesive layer 430B may be disposed between the protruded portion 400E of the second chip stack 400 and the second region 550L of the supporting block 550. The first adhesive layer 430B may attach the protruded portion 400E of the second chip stack 400 to the second region 550L of the supporting block 550. The first adhesive layer 430B may extend into an interface between the first chip stack 300 and the second chip stack 400 to attach the second chip stack 400 to the first chip stack 300. In such case, the supporting block 550 may be disposed to be laterally spaced part from the first chip stack 300 by a certain distance D.

The first chip stack 300 and the supporting block 550 may be disposed on the package substrate 100 such that a first top surface 300T corresponding to a top surface of the first chip stack 300 and a second top surface 550T corresponding to a top surface of the supporting block 550 are located at substantially the same level. The second chip stack 400 may be disposed on both of the first top surface 300T of the first chip stack 300 and the second top surface 550T of the supporting block 550 to be stably supported by the first chip stack 300 and the supporting block 550.

The protruded portion 400E of the second chip stack 400 may be supported by the second region 550L of the supporting block 550. Some pads 415B of the second chip pads 415 may be located on the protruded portion 400E of the second chip stack 400 to vertically overlap with the second region 550L of the supporting block 550. As illustrated in FIG. 5, a second lowermost semiconductor chip 410b corresponding to a lowermost chip among the second semiconductor chips 410 constituting the second chip stack 400 may include the second chip pads 415b, and the second chip pads 415b may be located to overlap with the second region 550L of the supporting block 550. Accordingly, the second chip pads 415b of the second lowermost semiconductor chip 410b may be supported by the second region 550L of the supporting block 550. Thus, when the second interconnectors 470 are wire-bonded to the second chip pads 415b, pressure or shock may be applied to the second region 550L of the supporting block 550. The supporting block 550 may resist against the pressure or the shock generated by the bonding process and may support the protruded portion 400E of the second chip stack 400. Because the supporting block 550 supports the protruded portion 400E including the second chip pads 415b, the supporting block 550 may prevent the protruded portion 400E of the second chip stack 400 from being warped or damaged while the bonding process is performed.

If the supporting block 550 is absent, the protruded portion 400E including the second chip pads 415b may warp downwardly due to the pressure or the shock generated during the bonding process. If the protruded portion 400E including the second chip pads 415b warps downwardly during the bonding process, it may be difficult to accurately bond the second interconnectors 470 to the second chip pads 415B. That is, bonding failure may occur if the supporting block 550 is absent. However, according to the present embodiment, the second interconnectors 470 may be accurately bonded to the second chip pads 415B because of the presence of the supporting block 550 supporting the protruded portion 400E including the second chip pads 415B.

Figure 6:
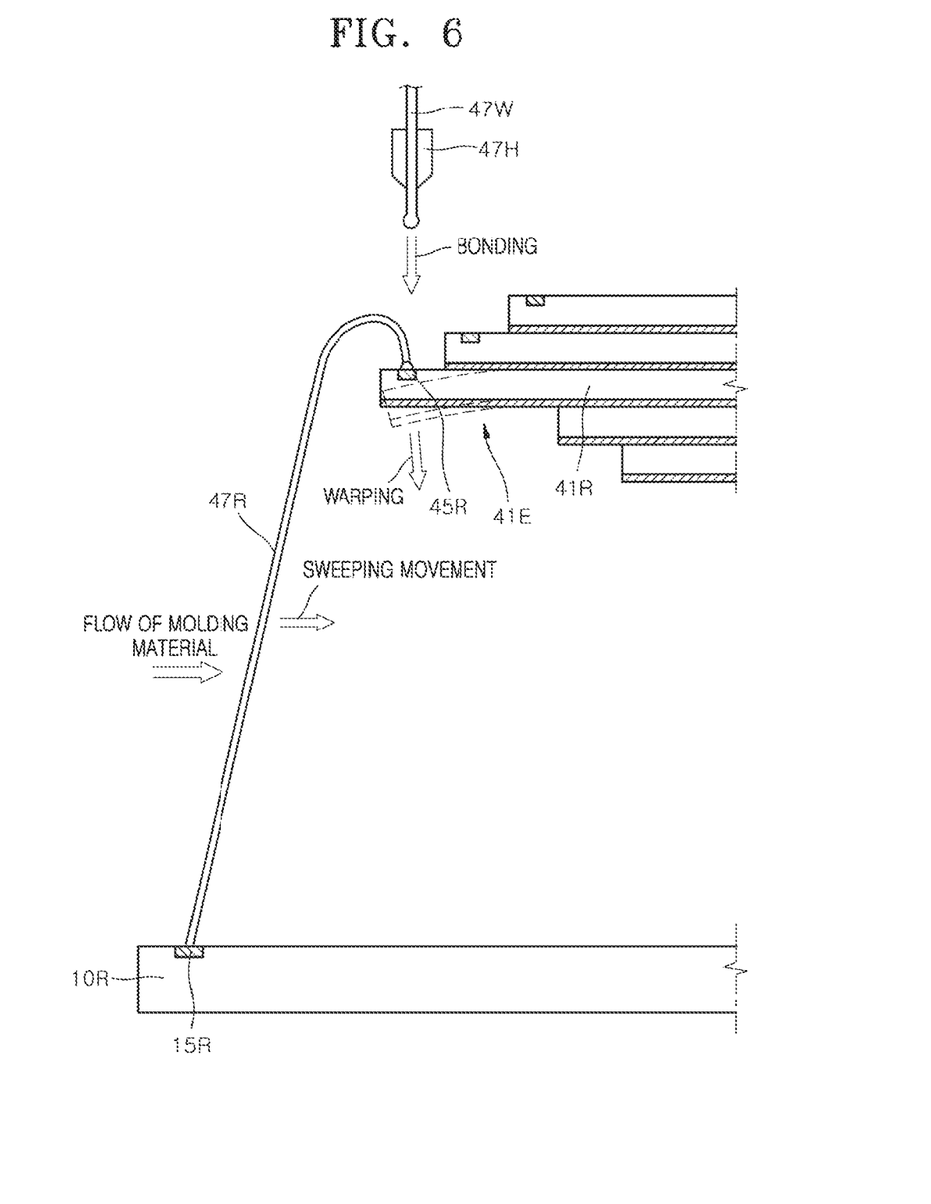
FIG. 6 shows a schematic view illustrating a bonding failure caused by a wire bonding process in a comparative example.

FIG. 6 shows a schematic view illustrating a bonding failure phenomenon caused by a wire bonding process in a comparative example.

Referring to FIG. 6, the comparative example may correspond to a case for which an extruded portion 41E of a semiconductor chip 41R corresponding to the second lowermost semiconductor chip 410B of FIG. 2 is not supported by the supporting block (550 of FIG. 2). A wire bonder 47H may lead and bond a wire 47W to a chip pad 45R located on the extruded portion 41E of the semiconductor chip 41R. When the wire 47W is bonded to the chip pad 45R, pressure and/or shock may be applied to the extruded portion 41E of the semiconductor chip 41R. In such a case, because there is nothing to support the extruded portion 41E of the semiconductor chip 41R, the extruded portion 41E of the semiconductor chip 41R may warp downwardly. If the extruded portion 41E of the semiconductor chip 41R warps downwardly, a position and a level of the chip pad 45R may change. Thus, it may be difficult to accurately bond a bonding wire 47R to the chip pad 45R. That is, the bonding wire 47R may not be accurately bonded to the chip pad 45R to cause a bonding failure.

However, according to the present embodiment illustrated in FIGS. 2 and 5, the second interconnectors 470 may be wire-bonded to the second chip pads 415B while the second chip pads 415B of the second lowermost semiconductor chip 410B are stably supported by the second region 550L of the supporting block 550. Thus, it may be possible to prevent a bonding failure phenomenon of the second interconnectors 470 from occurring.

Referring again to FIG. 6, the semiconductor chip 41R is electrically connected to bonding fingers 15R of a package substrate 10R corresponding to the package substrate 100 of FIG. 2 through the bonding wire 47R. In such a case, because the semiconductor chip 41R is located at a relatively high level, a length of the bonding wire 47R may be greater than a length of the second interconnectors 470 illustrated n FIG. 2. Accordingly, during a molding process using an epoxy molding compound (EMC) material, lateral pressure due to flow of the EMC material may be applied to the bonding wire 47R.

The bonding wire 47R having a relatively long length may be easily deformed or damaged by the lateral pressure generated due to the flow of the EMC material. The lateral pressure generated due to the flow of the EMC material may laterally sweep the bonding wire 47R to cause a sweeping failure of the bonding wire 47R. In such a case, the bonding wire 47R may be deformed or damaged to be electrically connected to another bonding wire adjacent to the bonding wire 47R or to cause an open failure of the bonding wire 47R.

However, according to the present embodiment illustrated in FIGS. 2 and 5, the supporting block 550 or a combined structure of the supporting block 550 and the interposer 510 may provide a connection path that electrically connects the second chip stack 400 to the package substrate 100. Because the second interconnectors 470 are electrically connect the second chip stack 400 to the supporting block 550, a length of the second interconnectors 470 may be reduced as compared with a length of the bonding wire 47R included in the comparative example shown in FIG. 6. Thus, even though the pressure due to the flow of the EMC material is applied to the second interconnectors 470 during a molding process for forming a molding layer 600 covering the first and second chip stacks 300 and 400 and the second interconnectors 470, a sweeping failure of the second interconnectors 470 may be effectively suppressed because the second interconnectors 470 have a reduced length.

Referring again to FIG. 1, the semiconductor package 10 may further include a lifting dielectric layer 250 disposed between the package substrate 100 and the first chip stack 300. The lifting dielectric layer 250 may lift the first chip stack 300 to increase a distance between the package substrate 100 and the first chip stack 300. The lifting dielectric layer 250 may act as an adhesive layer that attaches the first chip stack 300 to the package substrate 100. A third semiconductor chip 210 may be disposed between the first chip stack 300 and the package substrate 100 or between the lifting dielectric layer 250 and the package substrate 100. The third semiconductor chip 210 may be attached to the package substrate 100 using a fourth adhesive layer 230. The third semiconductor chip 210 may include a controller chip that controls operations of the first and second semiconductor chips 310 and 410.

The third semiconductor chip 210 may be electrically connected to the package substrate 100 through fourth interconnectors 270. The fourth interconnectors 270 may be realized using fourth bonding wires. The third semiconductor chip 210 may include third chip pads 211 for electrical connection of the third semiconductor chip 210, and the package substrate 100 may include third bonding fingers 111 which are electrically connected to the third chip pads 211. The fourth bonding wires employed as the fourth interconnectors 270 may electrically connect the third bonding fingers 111 to the third chip pads 211. The third bonding fingers 111 may be a portion of the circuit interconnection structure (not shown) included in the package substrate 100. The lifting dielectric layer 250 may be disposed to cover the third semiconductor chip 210 and the fourth interconnectors 270. In such a case, the third semiconductor chip 210 and the fourth interconnectors 270 may be substantially embedded in the lifting dielectric layer 250.

Figure 7:
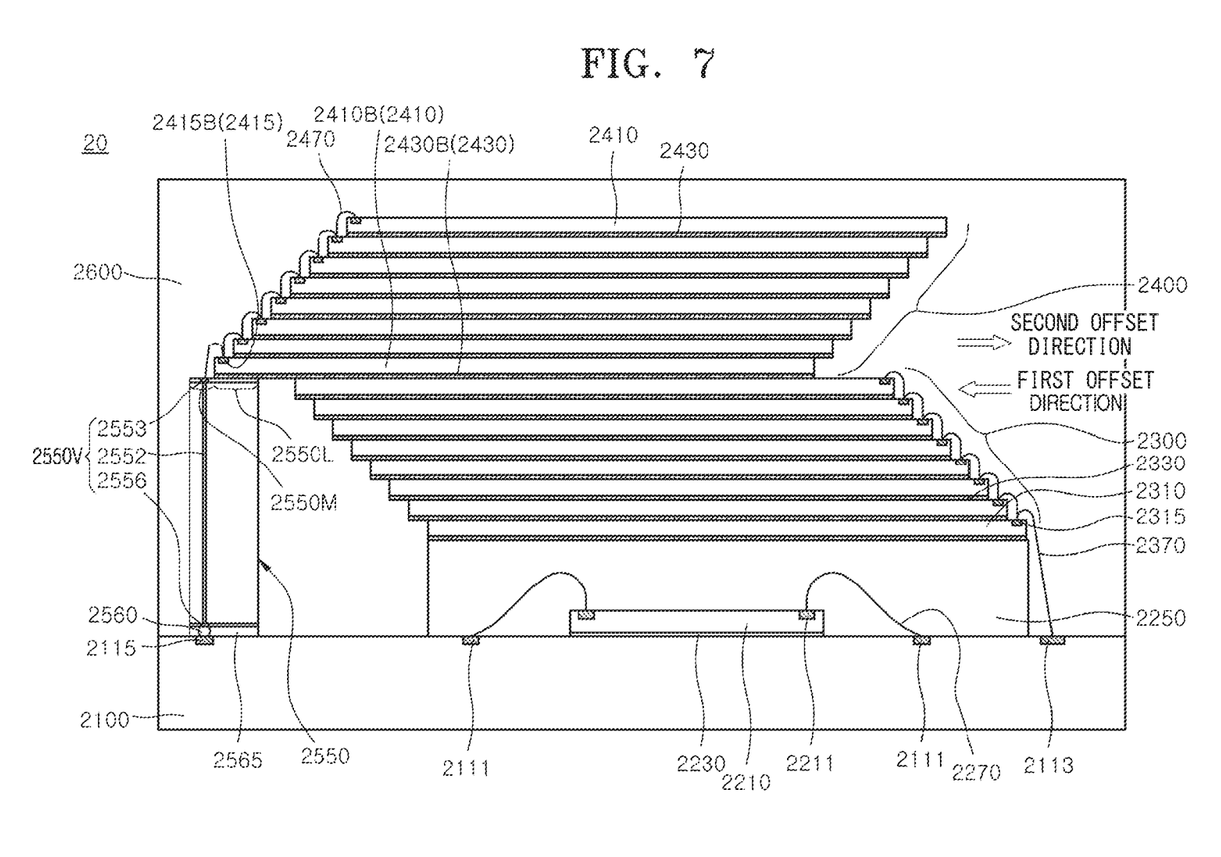
FIG. 7 shows a cross-sectional view illustrating a semiconductor package, according to another embodiment.
Figure 8:
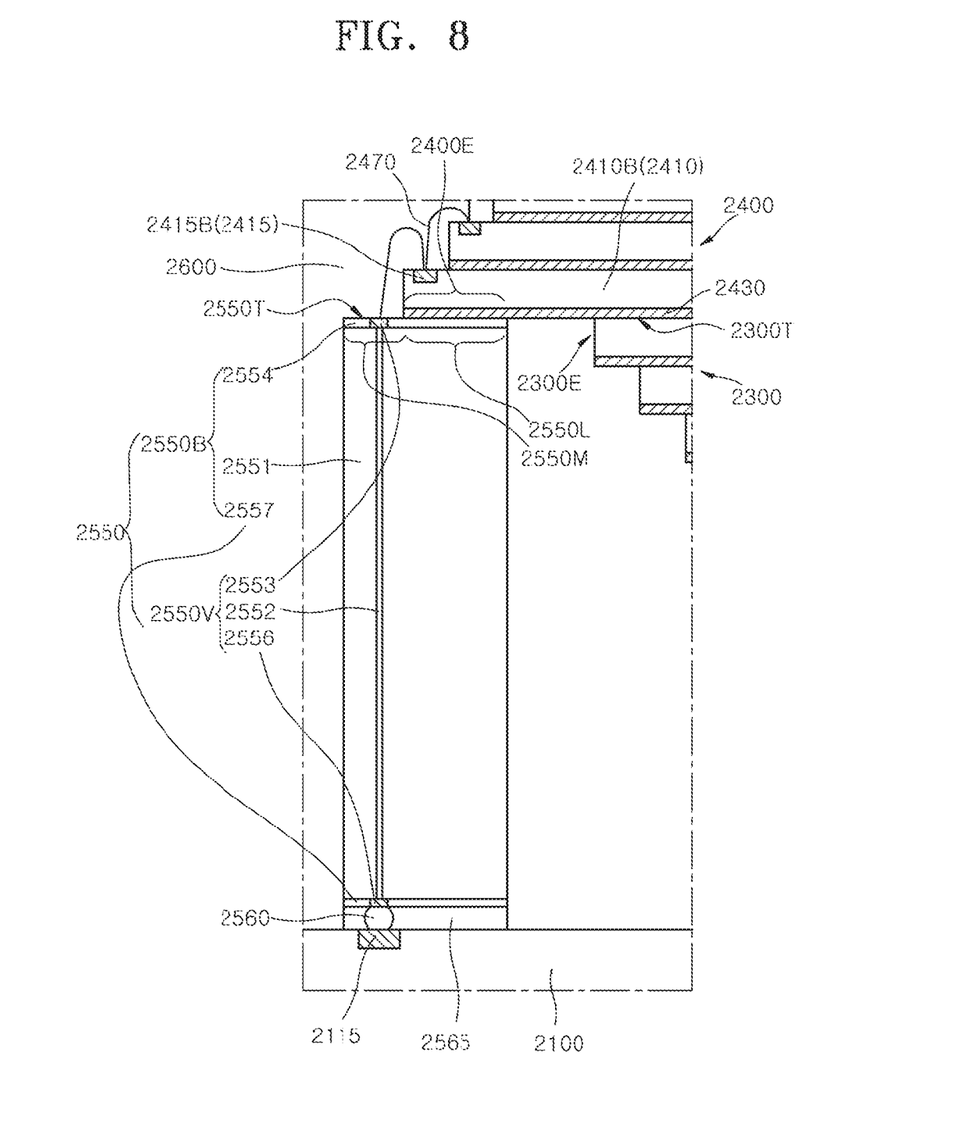
FIG. 8 shows an enlarged view illustrating a joint portion of a package substrate and a supporting block included in the semiconductor package of FIG. 7.

FIG. 7 shows a cross-sectional view illustrating a semiconductor package 20 according to another embodiment. FIG. 8 shows an enlarged view illustrating a joint portion of a package substrate 2100 and a supporting block 2550 included in the semiconductor package 20 of FIG. 7.

Referring to FIGS. 7 and 8, the semiconductor package 20 may be configured to include the package substrate 2100, a first chip stack 2300, a second chip stack 2400, and the supporting block 2550. A molding layer 2600 may be disposed on a surface of the package substrate 2100 to cover the first chip stack 2300, the second chip stack 2400, and the supporting block 2550. The semiconductor package 20 may be configured such that the second chip stack 2400 is electrically connected to the package substrate 2100 through the supporting block 2550. The supporting block 2550 may be directly connected to the package substrate 2100 without using any intervening element, such as the interposer (510 of FIG. 1), unlike for the semiconductor package 10 illustrated in FIG. 1. The second chip stack 2400 may be disposed on both of the supporting block 2550 and the first chip stack 2300. That is, the second chip stack 2400 may be supported by the supporting block 2550 and the first chip stack 2300.

As illustrated in FIG. 8, the first chip stack 2300 and the supporting block 2550 may be disposed on the package substrate 2100 such that a first top surface 2300T corresponding to a top surface of the first chip stack 2300 and a second top surface 2550T corresponding to a top surface of the supporting block 2550 are located at substantially the same level. The second chip stack 2400 may be disposed on both of the first top surface 2300T of the first chip stack 2300 and the second top surface 2550T of the supporting block 2550 to be stably supported by the first chip stack 2300 and the supporting block 2550.

First semiconductor chips 2310 may be stacked to be offset in a first offset direction to constitute the first chip stack 2300. The first semiconductor chips 2310 may be attached to each other by adhesive layers 2330 disposed therebetween. Second semiconductor chips 2410 may be stacked to be offset in a second offset direction that is substantially opposite to the first offset direction, thereby constituting the first chip stack 2400. The second semiconductor chips 2410 may be attached to each other by adhesive layers 2430 disposed therebetween.

The first semiconductor chips 2310 of the first chip stack 2300 may be electrically connected to the package substrate 2100 through first interconnectors 2370. First bonding wires employed as the first interconnectors 2370 may electrically connect the first chip pads 2315 of the first semiconductor chips 2310 to each other and may extend to be connected to first bonding fingers 2113 of the package substrate 2100.

The second semiconductor chips 2410 of the second chip stack 2400 may be electrically connected to each other through second interconnectors 2470, and the second interconnectors 2470 may extend to electrically connect the second chip stack 2400 to the supporting block 2550. Second bonding wires employed as the second interconnectors 2470 may electrically connect second chip pads 2415 of the second semiconductor chips 2410 to each other and may extend to be connected to the supporting block 2550.

The second interconnectors 2470 may be electrically connected to second bonding fingers 2115 of the package substrate 2100 through the supporting block 2550. The supporting block 2550 may be disposed to overlap with the second bonding fingers 2115 of the package substrate 2100 and may be electrically connected to the second bonding fingers 2115 of the package substrate 2100.

Referring to FIG. 8, through via structures 2550V may be disposed to vertically penetrate the supporting block 2550. The supporting block 2550 may be configured to include a block body 2550B and the through via structures 2550V vertically penetrating the block body 2550B. Each of the through via structures 2550V may be configured to include a first via pad 2553 and a second via pad 2556 that are opposite to each other as well as a vertical via portion 2552 that connects the first via pad 2553 to the second via pad 2556. The first via pad 2553 may provide an upper end of each of the through via structures 2550V, and the second via pad 2556 may provide a lower end of each of the through via structures 2550V.

The block body 2550B may be configured to include a silicon body 2551, an upper dielectric layer 2554 and a lower dielectric layer 2557. The upper dielectric layer 2554 may be disposed on a top surface of the silicon body 2551 to reveal the first via pads 2553 of the through via structures 2550V, and the lower dielectric layer 2557 may be disposed on a bottom surface of the silicon body 2551 to reveal the second via pads 2556 of the through via structures 2550V. The vertical via portions 2552 of the through via structures 2550V may correspond to through silicon vias (TSVs) vertically penetrating the silicon body 2551. First ends of the second interconnectors 2470 may be bonded to the first via pads 2553 of the through via structures 2550V such that the second interconnectors 2470 electrically connect the second chip stack 2400 to the vertical via portions 2552 of the through via structures 2550V.

Conductive bumps 2560 may be disposed between the supporting block 2550 and the package substrate 2100 to act as inner conductors that electrically connect the supporting block 2550 to the package substrate 2100. The conductive bumps 2560 may electrically and directly connect the second via pads 2556 (corresponding to lower ends) of the through via structures 2550V to the second bonding fingers 2115 of the package substrate 2100. The conductive bumps 2560 may be electrically insulated from each other by a second adhesive layer 2565 surrounding side surfaces of the conductive bumps 2560, and the second adhesive layer 2565 may attach the supporting block 2550 to the package substrate 2100. The second adhesive layer 2565 may be a non-conductive film (NCF). The second bonding fingers 2115 of the package substrate 2100 may be disposed to vertically overlap with the second via pads 2556 of the supporting block 2550, respectively. The second bonding fingers 2115 of the package substrate 2100 may be located to overlap with the through via structures 2550V of the supporting block 2550.

Referring again to FIG. 8, the supporting block 2550 may include a first region 2550M and a second region 2550L that are divided into two parts. The through via structures 2550V may be disposed to substantially penetrate the block body 2550B in the first region 2550M of the supporting block 2550. For an embodiment, none of the through via structures 2550V are disposed in the second region 2550L adjacent to the first region 2550M of the supporting block 2550.

In a stack structure for which the second chip stack 2400 is stacked on the first chip stack 2300, a portion 2400E of the second chip stack 2400 may laterally protrude from an edge portion 2300E of the first chip stack 2300. The protruded portion 2400E of the second chip stack 2400 may be supported by the second region 2550L of the supporting block 2550. A first adhesive layer 2430B may be disposed between the protruded portion 2400E of the second chip stack 2400 and the second region 2550L of the supporting block 2550. The first adhesive layer 2430b may extend into an interface between the first chip stack 2300 and the second chip stack 2400 to attach the second chip stack 2400 to the first chip stack 2300.

A second lowermost semiconductor chip 2410b corresponding to a lowermost chip among the second semiconductor chips 2410 constituting the second chip stack 2400 may include second chip pads 2415b, and the second chip pads 2415b may be located to overlap with the second region 2550L of the supporting block 2550. Accordingly, the second chip pads 2415b of the second lowermost semiconductor chip 2410b may be supported by the second region 2550L of the supporting block 2550. Thus, when the second interconnectors 2470 are wire-bonded to the second chip pads 2415b, the supporting block 2550 may prevent a bonding failure between the second interconnectors 2470 and the second chip pads 2415b from occurring.

Referring again to FIG. 7, the semiconductor package 20 may further include a lifting dielectric layer 2250 disposed between the package substrate 2100 and the first chip stack 2300. A third semiconductor chip 2210 may be disposed between the first chip stack 2300 and the package substrate 2100 or between the lifting dielectric layer 2250 and the package substrate 2100. The third semiconductor chip 2210 may be attached to the package substrate 2100 using a fourth adhesive layer 2230. The third semiconductor chip 2210 may include a controller chip that controls operations of the first and second semiconductor chips 2310 and 2410. Third chip pads 2211 of the third semiconductor chip 2210 may be electrically connected to third bonding fingers 2111 of the package substrate 2100 through fourth bonding wires employed as fourth interconnectors 2270.

According to the embodiments, a semiconductor package may include an upper chip stack, a lower chip stack and a supporting block which are disposed on a package substrate. The upper chip stack may be supported by the lower chip stack and the supporting block. The supporting block may include through via structures penetrating a block body of the supporting block, and the through via structures may provide electrical paths that electrically connect the upper chip stack to the package substrate.

Figure 9:
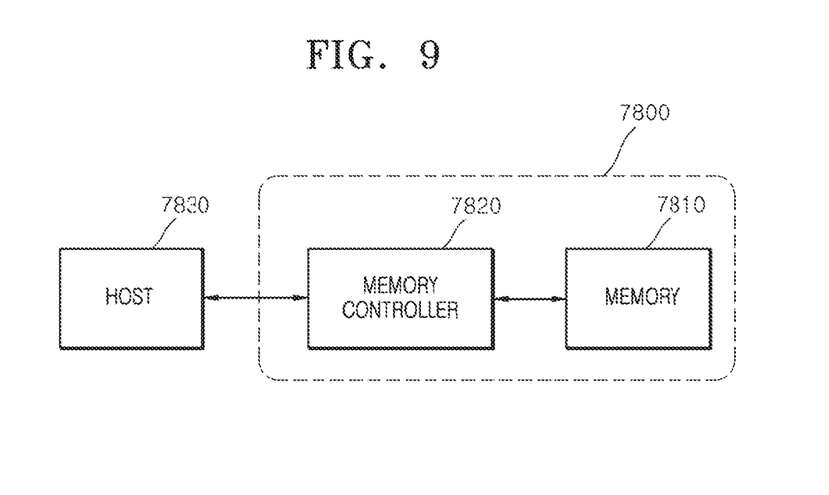
FIG. 9 shows a block diagram illustrating an electronic system employing a memory card including a semiconductor package, according to an embodiment.

FIG. 9 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 10:
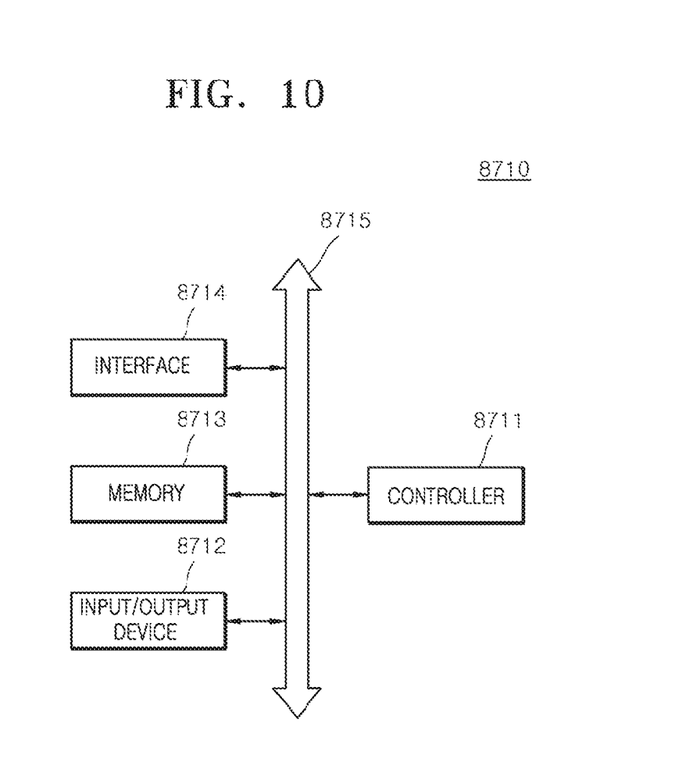
FIG. 10 shows a block diagram illustrating another electronic system including a semiconductor package, according to an embodiment.

FIG. 10 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution), or Wibro (wireless broadband Internet).

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A semiconductor package comprising:
   a first chip stack including first semiconductor chips vertically stacked on a package substrate, wherein the first semiconductor chips are offset in a first direction;
   an interposer comprising a redistributed layer (RDL) pattern, wherein the interposer is disposed on the package substrate and laterally spaced apart from the first chip stack, and wherein the RDL pattern includes a first connection part, a second connection part, and an extension part connecting the first connection part to the second connection part;
   a supporting block vertically stacked on the interposer, wherein the supporting block comprises a through via structure with a lower end electrically connected to the first connection part of the interposer;
   a second chip stack including second semiconductor chips vertically stacked on both of the first chip stack and the supporting block, wherein the second semiconductor chips are offset in a second direction;
   a first interconnector electrically connecting the first semiconductor chips to the package substrate;
   a second interconnector electrically connecting the second semiconductor chips to an upper end of the through via structure; and
   a third interconnector electrically connecting the second connection part of the RDL pattern to the package substrate.

2. The semiconductor package of claim 1, wherein the first interconnector is located at a side of the first chip stack opposite to the supporting block.

3. The semiconductor package of claim 1,
   wherein the first interconnector is a first bonding wire that electrically connects the first semiconductor chips to each other and that extends to be bonded to the package substrate;
   wherein the second interconnector is a second bonding wire that electrically connects the second semiconductor chips to each other and that extends to be bonded to the through via structure; and
   wherein the third interconnector is a third bonding wire, one end of which is bonded to the second connection part and the other end of which is connected to the package substrate.

4. The semiconductor package of claim 1, wherein the supporting block further comprises:
   a block body including a first region in which the through via structure is located and a second region with which an edge portion of the second chip stack vertically overlaps;
   a first via pad exposed at a top surface of the block body to provide the upper end of the through via structure;
   a second via pad exposed at a bottom surface of the block body to provide the lower end of the through via structure; and
   a vertical via portion of the through via structure connecting the first via pad to the second via pad.

5. The semiconductor package of claim 4,
wherein the block body comprises a silicon body; and
wherein the vertical via portion comprises a through silicon via (TSV) penetrating the silicon body.

6. The semiconductor package of claim 4, further comprising a first adhesive layer disposed between the second region of the block body and the second chip stack.

7. The semiconductor package of claim 6, wherein the first adhesive layer extends into an interface between the second chip stack and the first chip stack.

8. The semiconductor package of claim 4,
wherein a second lowermost semiconductor chip corresponding to a lowermost chip among the second semiconductor chips of the second chip stack includes a chip pad which is connected to the second interconnector; and
wherein the chip pad is located to overlap the second region of the block body of the supporting block.

9. The semiconductor package of claim 1, wherein the supporting block is laterally spaced apart from the first chip stack.

10. The semiconductor package of claim 1, further comprising:
a conductive bump disposed between the interposer and the supporting block to electrically connect the first connection part of the interposer to the lower end of the through via structure; and
a second adhesive layer surrounding a side surface of the conductive bump and attaching the interposer to the supporting block.

11. The semiconductor package of claim 10, wherein the second adhesive layer includes a non-conductive film (NCF).

12. The semiconductor package of claim 1, further comprising a third adhesive layer disposed between the interposer and the package substrate to attach the interposer to the package substrate.

13. The semiconductor package of claim 12,
wherein the package substrate includes a bonding finger which is connected to the third interconnector;
wherein the interposer is attached to the package substrate using the third adhesive layer to reveal the bonding finger of the package substrate; and
wherein the bonding finger is located to be overlapped by the second chip stack.

14. The semiconductor package of claim 1, wherein the supporting block overlaps a portion of the interposer to reveal the second connection part.

15. The semiconductor package of claim 1, wherein the second direction is opposite to the first direction.

16. The semiconductor package of claim 1, further comprising:
a third semiconductor chip disposed between the first chip stack and the package substrate; and
a lifting dielectric layer disposed to cover the third semiconductor chip and to lift and support the first chip stack.

17. The semiconductor package of claim 16, wherein the third semiconductor chip is a controller chip that controls operations of the first and second semiconductor chips.

18. The semiconductor package of claim 1,
wherein the first chip stack and the supporting block are disposed on the package substrate such that a first top surface corresponding to a top surface of the first chip stack and a second top surface corresponding to a top surface of the supporting block are located at substantially the same level; and
wherein the second chip stack is disposed on both of the first top surface of the first chip stack and the second top surface of the supporting block.

19. A semiconductor package comprising:
a package substrate comprising a bonding finger;
a first chip stack disposed on the package substrate to be spaced apart from the bonding finger, the first chip stack comprising first semiconductor chips stacked to be offset in a first direction;
a supporting block disposed on the package substrate to be spaced part from the first chip stack, the supporting block comprising a block body and a through via structure having a lower end that is electrically connected to the bonding finger;
a second chip stack including second semiconductor chips that are vertically stacked on both of the first chip stack and the supporting block, wherein the second semiconductor chips are offset in a second direction;
a first interconnector electrically connecting the first semiconductor chips to the package substrate; and
a second interconnector electrically connecting the second semiconductor chips to an upper end of the through via structure,
wherein the block body of the supporting block includes a first region and a second region,
wherein a chip pad of a lowermost second semiconductor chip among the second semiconductor chips of the second chip stack is located to overlap the second region to be supported by the block body, and
wherein the second interconnector is connected to the chip pad.

20. The semiconductor package of claim 19,
wherein the first chip stack and the supporting block are disposed on the package substrate such that a first top surface corresponding to a top surface of the first chip stack and a second top surface corresponding to a top surface of the supporting block are located at substantially the same level; and
wherein the second chip stack is disposed on both of the first top surface of the first chip stack and the second top surface of the supporting block.

* * * * *